United States Patent
Lee et al.

(10) Patent No.: US 9,899,619 B2
(45) Date of Patent: Feb. 20, 2018

(54) ELECTROLUMINESCENT DIODE HAVING DELAYED FLORESCENCE QUANTUM DOT

(71) Applicant: RESEARCH & BUSINESS FOUNDATION SUNGKYUNKWAN UNIVERSITY, Suwon-si (KR)

(72) Inventors: Jun Yeob Lee, Yongin-si (KR); Heeyeop Chae, Seoul (KR); Namhun Kim, Suwon-si (KR); Sangkyu Jeon, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/374,450

(22) Filed: Dec. 9, 2016

(65) Prior Publication Data

US 2017/0186986 A1 Jun. 29, 2017

(30) Foreign Application Priority Data

Dec. 10, 2015 (KR) .................. 10-2015-0176095

(51) Int. Cl.
*H01L 51/50* (2006.01)
*H01L 51/56* (2006.01)

(52) U.S. Cl.
CPC ........ *H01L 51/502* (2013.01); *H01L 51/5004* (2013.01); *H01L 51/56* (2013.01); *H01L 2251/552* (2013.01)

(58) Field of Classification Search
CPC . H01L 51/5012; H01L 33/06; H01L 51/5262; H01L 2251/5369; H01L 51/502; H01L 51/56; H01L 51/5004; H01L 2251/552
See application file for complete search history.

(56) References Cited

U.S. PATENT DOCUMENTS

2016/0301024 A1* 10/2016 He .................. H01L 51/5096

FOREIGN PATENT DOCUMENTS

JP          5049301 B2    6/2011
KR   10-2015-0135097 A    9/2009

* cited by examiner

*Primary Examiner* — Roy Potter
(74) *Attorney, Agent, or Firm* — NSIP Law

(57) ABSTRACT

The present invention relates to a delayed fluorescence-quantum dot (QD) electroluminescent diode, the delayed fluorescence-quantum dot electroluminescent diode includes an anode, a cathode, and a light emitting layer located between the anode and the cathode, and the light emitting layer includes a QD and a delayed fluorescence material which supplies energy to the QD.

14 Claims, 7 Drawing Sheets

ELECTROLUMINESCENT DIODE HAVING DELAYED FLORESCENCE QUANTUM DOT

CROSS-REFERENCE TO RELATED APPLICATIONS

This application claims the benefit under 35 USC 119(a) of Korean Patent Application No. 10-2015-0176095 filed on Dec. 10, 2015 in the Korean Intellectual Property Office, the entire disclosure of which is incorporated herein by reference for all purposes.

BACKGROUND

1. Field of the Invention

The present invention relates to an electroluminescent diode including a delayed florescence material and a quantum dot. More particularly, the present invention relates to an electroluminescent diode having a quantum dot in which luminous efficiency is improved using energy of a delayed florescence material.

2. Discussion of Related Art

A quantum dot (QD) is a semiconductor material with a crystalline structure having a size of several nanometers and has a characteristic of emitting light by itself through a quantum effect.

In particular, the number of free electrons is limited within a range of 1 to 100 because the QD has a large number of interior electrons but has a smaller size than an Exciton Bohr Radius thereof, energy levels of the electrons are limited to be discontinued, and the QD has electrical and optical characteristics different from that of a semiconductor which is in a bulk state forming a continuous band.

The QD can control an energy level thereof according to a size of the QD, and thus a band gap thereof can be controlled.

Accordingly, in a conventional organic light emitting diode (OLED) or the like, a type of organic material used therein should be changed in order to display different colors, but the QD has an advantage in that a simpler light emitter is manufactured because a color of emitted light is changed by controlling a size of the QD using the QD.

Further, a QD-electroluminescence diode has advantages of being capable of implementing a much more natural color with high color purity when compared to an active matrix organic light emitting diode (AMOLED), having a power consumption rate of about one-fifth of the AMOLED, having a relatively low cost, and being capable of being manufactured as a flexible display.

Due to the advantages described above, studies on an electroluminescent diode using a quantum dot are being actively conducted, but a problem in which a luminous efficiency of an electroluminescent diode using a quantum dot is low has not yet been solved even though continuous studies have been conducted.

CONVENTIONAL ART

Patent Document (Patent document 1) Korean Patent Registration No. 10-1437271

SUMMARY OF THE INVENTION

The present invention is directed to providing a delayed fluorescence-quantum dot (QD)-electroluminescent diode in which luminous efficiency is improved using an energy transfer mechanism.

The present invention is also directed to providing a delayed fluorescence-QD-electroluminescent diode in which luminous efficiency is improved using energy of a delayed fluorescence material.

The present invention is further directed to providing a delayed fluorescence-QD-electroluminescent diode in which luminous efficiency is improved by transferring energy of a host material to a delayed fluorescence material and receiving energy of the delayed fluorescence material.

According to one aspect of the present invention, there is provided a delayed fluorescence-QD-electroluminescent diode, including: an anode, a cathode, and a light emitting layer located between the anode and the cathode, wherein the light emitting layer includes a QD and a delayed fluorescence material which supplies energy to the QD.

The light emitting layer may be formed by mixing the QD and the delayed fluorescence material, and the light emitting layer may be formed by mixing the QD and the delayed fluorescence material at a mass ratio of 1:2 to 1:100.

Further, the light emitting layer may include a QD layer including the QD, and a delayed fluorescence layer located above or below the QD layer and including the delayed fluorescence material.

The QD layer may be located between the delayed fluorescence layer and the cathode, a recombination region of an electron injected through the cathode and a hole injected through the anode may be formed in the delayed fluorescence layer, and a thickness of the QD layer may be equal to or greater than that of the delayed fluorescence layer.

An energy level of excited singlet energy ($S1_B$) of the delayed fluorescence material may be equal to or greater than that of excited singlet energy ($S1_A$) of the QD.

The light emitting layer may further include a host material which supplies the energy to the delayed fluorescence material, and an energy level of excited singlet energy ($S1_C$) or excited triplet energy ($T1_C$) of the host material is equal to or greater than that of the excited singlet energy $S1_B$ of the delayed fluorescence material.

According to another aspect of the present invention, there is provided a method of manufacturing a delayed fluorescence-QD-electroluminescent diode including forming an anode, forming a light emitting layer, and forming a cathode, wherein the forming of the light emitting layer forms the light emitting layer by mixing a QD and a delayed fluorescence material which supplies energy to the QD so as to be located between the anode and the cathode.

According to still another aspect of the present invention, there is provided a method of manufacturing a delayed fluorescence-QD-electroluminescent diode including forming an anode, forming a light emitting layer, and forming a cathode, wherein the forming of the light emitting layer forms the light emitting layer by stacking a QD layer including a QD between the anode and the cathode and a delayed fluorescence layer including a delayed fluorescence material which supplies energy to the QD, and the quantum dot layer is located between the delayed fluorescence layer and the cathode.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
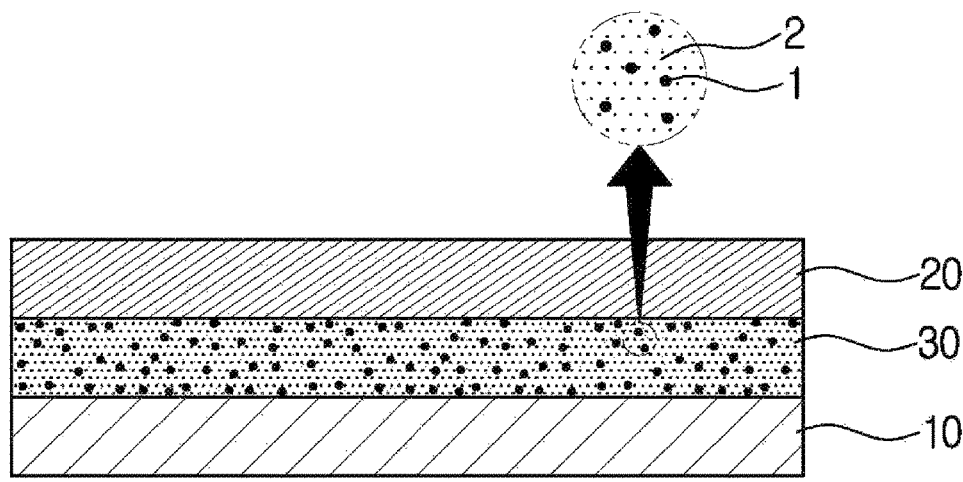
FIG. 1 is a cross-sectional view of a delayed fluorescence-quantum dot (QD)-electroluminescent diode according a first embodiment of the present invention.

Hereinafter, a quantum dot (QD)-electroluminescent diode according to the present invention will be described with reference to the accompanying drawings.

In this specification, only a portion needed for understanding the delayed fluorescence-QD-electroluminescent diode according to embodiments of the present invention will be described, and other descriptions will be omitted so as not to obscure the gist of the present invention.

Further, it should be understood that the terms and words used in this specification and claims are not to be interpreted as being restricted to their ordinary or dictionary meanings and have meanings and concepts consistent with the technical scope of the present invention so as to express the most appropriate representation of the present invention.

In various embodiments, like reference numerals refer to components having the same configuration, the components will be representatively described in a first embodiment, and a configuration different from that of the first embodiment will be described in other embodiments.

FIG. 1 is a cross-sectional view of a delayed fluorescence-QD-electroluminescent diode 100 according a first embodiment of the present invention.

Referring to FIG. 1, the delayed fluorescence-QD-electroluminescent diode 100 according to the first embodiment of the present invention may include an anode 10, a cathode 20, and a light emitting layer 30 located between the anode 10 and the cathode 20.

Although not shown in FIG. 1, in order to balance charge injection and recombination processes of the anode 10 and the cathode 20, a hole injection layer and a hole transporting layer may be further included between the anode 10 and the light emitting layer 30, and an electron transporting layer and an electron injection layer may be further included between the cathode 20 and the light emitting layer 30.

Generally, a conventional organic light emitting diode (OLED) that emits light using only an organic light emitting material may have various problems related to oxidation, black spots, lifetime, etc., of a device, but since a QD is an inorganic nanocrystal, an electroluminescent diode using the QD may solve the problems of the conventional OLED. In the conventional OLED, high-cost organic light emitting materials which are different from each other should be used in order to implement red, green, and blue (RGB) light, but in the electroluminescent diode having the QD, RGB light may be implemented by controlling only a size of a single material, which is the QD, because a light emitting wavelength is changed according to a size of a particle of the QD and all color of a visible ray region is implemented. Further, the electroluminescent diode having the QD may have high color reproducibility and color purity when compared with the conventional OLED and may be manufactured using a low-cost solution process because the QD is used in a colloidal state. Meanwhile, since efficiency of the QD is theoretically greater than that of the organic light emitting material, the electroluminescent diode having the QD may have greater efficiency than the conventional OLED.

However, when actually using a QD as a light emitting layer, the efficiency of the existing electroluminescent diode having the QD is not greater than that of the conventional OLED because it is not easy to restrain excitons within the QD. In more detail, when a forward bias is applied to the electroluminescent diode, electrons may be injected from a cathode thereof, charges injected into a light emitting material in a process in which the electrons are moved to an opposite electrode through hopping to an adjacent QD may form excitons, and excited energy may be converted into light and be emitted when the excitons are decoupled. However, theoretical efficiency of the electroluminescent diode may not be great compared to an actual efficiency thereof because it is not easy to restrain excitons within the QD.

In order to solve the problem, the delayed fluorescence-QD-electroluminescent diode 100 according the first embodiment of the present invention may include a delayed fluorescence material 2 together with a QD 1 to form the light emitting layer 30. The delayed fluorescence material 2 may improve luminous efficiency of the QD by supplying energy to the QD 1. In the embodiment, the QD 1 and the delayed fluorescence material 2 may be mixed with each other to form a single light emitting layer 30. For example, the light emitting layer 30 may be formed by a spin coating method after dispersing the QD 1 and the delayed fluorescence material 2 in a solvent capable of dissolving both of the QD 1 and the delayed fluorescence material 2. In this case, a total thickness of the light emitting layer 30 may be preferably formed to be in a range of about 20 nm to 50 nm, but is not limited thereto. On the contrary, in another embodiment, the light emitting layer 30 may be formed to have a multilayer structure including a plurality of layers.

A known QD may be used as the QD 1 without limitation. For example, the QD 1 may be a group II-VI compound, a group II-V compound, a group III-V compound, a group III-IV compound, a group III-VI compound, a group IV-VI compound or a mixture thereof. The "mixture" may include not only a single mixture of the above compounds, but may also include a mixture in which a dopant is doped in a ternary compound, a quaternary compound, or a mixture thereof.

Examples of the group II-VI compound may include magnesium sulfide (MgS), magnesium selenide (MgSe), magnesium telluride (MgTe), calcium sulfide (CaS), calcium selenide (CaSe), calcium telluride (CaTe), strontium sulfide (SrS), strontium selenide (SrSe), strontium telluride (SrTe), cadmium sulfide (CdS), cadmium selenide (CdSe), cadmium telluride (CdTe), zinc sulfide (ZnS), zinc selenide (ZnSe), Zinc telluride (ZnTe), mercury sulfide (HgS), mercury selenide (HgSe), mercury telluride (HgTe), etc.

Examples of the group II-V compound may include zinc phosphide (Zn3P2), zinc arsenide (Zn3As2), cadmium phosphide (Cd3P2), cadmium arsenide (Cd3As2), cadmium nitride (Cd3N2), zinc nitride (Zn3N2), etc.

Examples of the group III-V compound may include boron phosphide (BP), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), aluminum nitride (AlN), boron nitride (BN), etc.

Examples of the group III-IV compound may include boron carbide (B4C), aluminum carbide (Al4C3), gallium carbide (Ga4C), etc.

Examples of the group III-VI compound may include aluminum sulfide (Al2S3), aluminum selenide (Al2Se3), aluminum telluride (Al2Te3), gallium sulfide (Ga2S3), gallium selenide (Ga2Se3), indium sulfide (In2S3), indium selenide (In2Se3), gallium telluride (Ga2Te3), indium telluride (In2Te3), etc.

Examples of the group IV-VI compound may include lead sulfide (PbS), lead selenide (PbSe), lead telluride (PbTe), tin sulfide (SnS), tin selenide (SnSe), and tin telluride (SnTe), etc.

As an embodiment, the QD 1 may have a core/shell structure. Each of the core and the shell of the QD 1 may be composed of the compounds described above. The compounds described above may be used alone or in a combination of two or more to form the core or shell. A band gap of the compound constituting the core may be smaller than that of the compound constituting the shell, but the band gap is not limited thereto. However, when the QD 1 has the core/shell structure, the compound constituting the shell may be different from that which constitutes the core. For example, the QD 1 may have a CdSe/ZnS (core/shell) structure including a core containing CdSe and a shell containing ZnS, an InP/ZnS (core/shell) structure including a core containing InP and a shell containing ZnS, etc. Further, the QD may have a core/multishell structure having at least two or more shells. For example, the QD 1 may have a CdSe/ZnSe/ZnS (core/first shell/second shell) structure including a core containing CdSe, a first shell surrounding a surface of the core and containing ZnSe, and a second shell surrounding a surface of the first shell and containing ZnS. In addition, a center particle 21 may have an InP/ZnSe/ZnS (core/first shell/second shell) structure including a core containing InP, a first shell containing ZnSe, and a second shell containing ZnS.

A known delayed fluorescence material may be used as the delayed fluorescence material 2 without limitation. However, it is preferable that singlet energy of the delayed fluorescence material 2 be equal to or greater than singlet energy of the QD 1 so that the singlet energy of the delayed fluorescence material 2 is transferable to the QD 1. In this case, the singlet energy of the delayed fluorescence material 2 may be transferred to the QD 1 to excite many more electrons in the QD 1 in a singlet energy state, many more excitons may be formed in the QD 1 in comparison to when the delayed fluorescence material 2 is not mixed, and luminous efficiency of the QD 1 can be improved.

The delayed fluorescence material 2 is a material developed and currently used as a material of an OLED and is an OLED material capable of transitioning in reverse from a triplet state to a singlet state because an energy gap between singlet energy $S_1$ and triplet energy $T_1$ is very small, such as within 0 to 0.5 eV.

In a general organic fluorescence material, 25% of excited electrons are excited in a singlet state $S_1$, 75% thereof are excited in a triplet state $T_1$, and a limited value of luminous efficiency of the organic fluorescence material is 25% because the organic fluorescence material emits fluorescent light while transitioning from the singlet state $S_1$ to a ground state $S_0$. However, the delayed fluorescence material is a material which emits additional (delayed) fluorescent light by performing a reverse energy movement transitioning from the triplet state $T_1$ to the singlet state $S_1$ by activation due to activated external heat or the like because the energy gap between the singlet energy $S_1$ and the triplet energy $T_1$ is very small, and is a material which is attracting attention as a new organic fluorescence material capable of solving the luminous efficiency problem of the conventional organic fluorescence material.

On the other hand, the light emitting layer 30 may further include a host material capable of supplying energy to the delayed fluorescence material 1 and the QD 2. As an example of the host material, a host material which emits delayed fluorescent light may be used without limitation. However, in order to supply energy to the delayed fluorescence material 1, excited singlet energy and/or excited triplet energy of the host material may be preferably equal to or greater than excited singlet energy of the delayed fluorescence material.

Figure 2A:
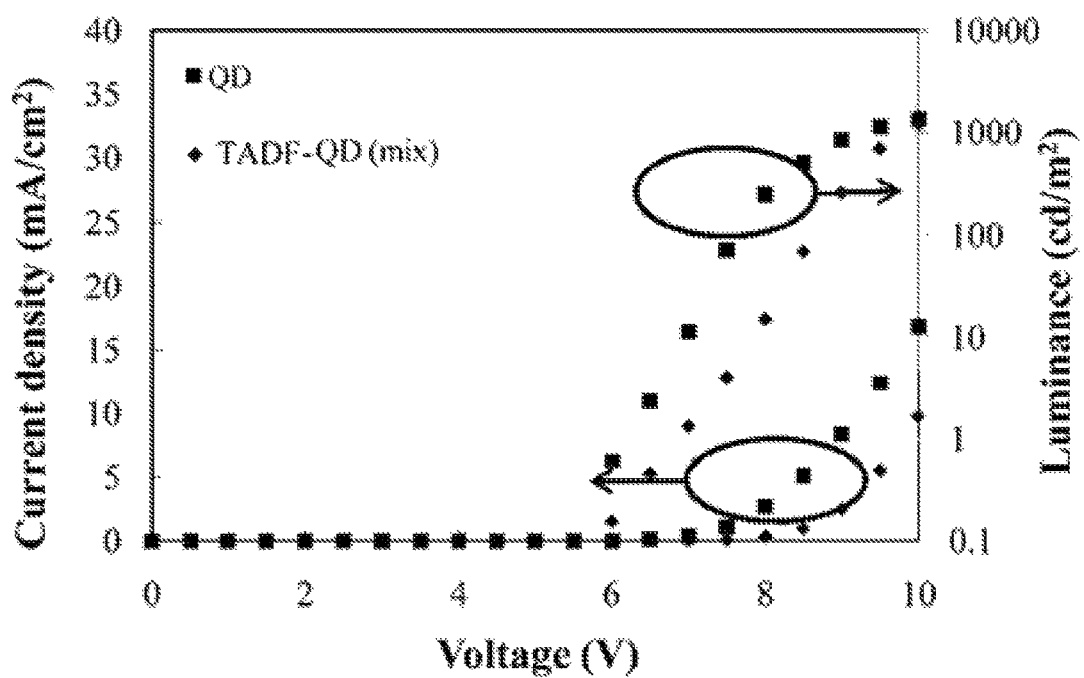
FIGS. 2A to 2C are graphs for comparing luminous efficiencies of a delayed fluorescence-QD-electroluminescent diode (TADF-QD(mix)) according to the first embodiment of the present invention and a QD-electroluminescent diode (QD) according to comparative example 1.
Figure 2B:
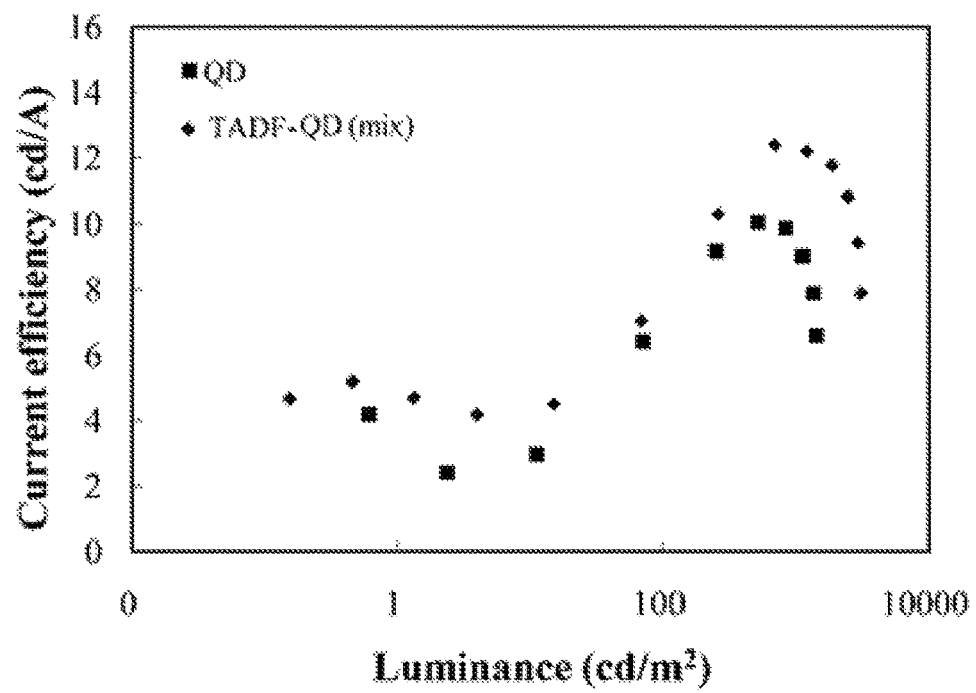
Figure 2C:
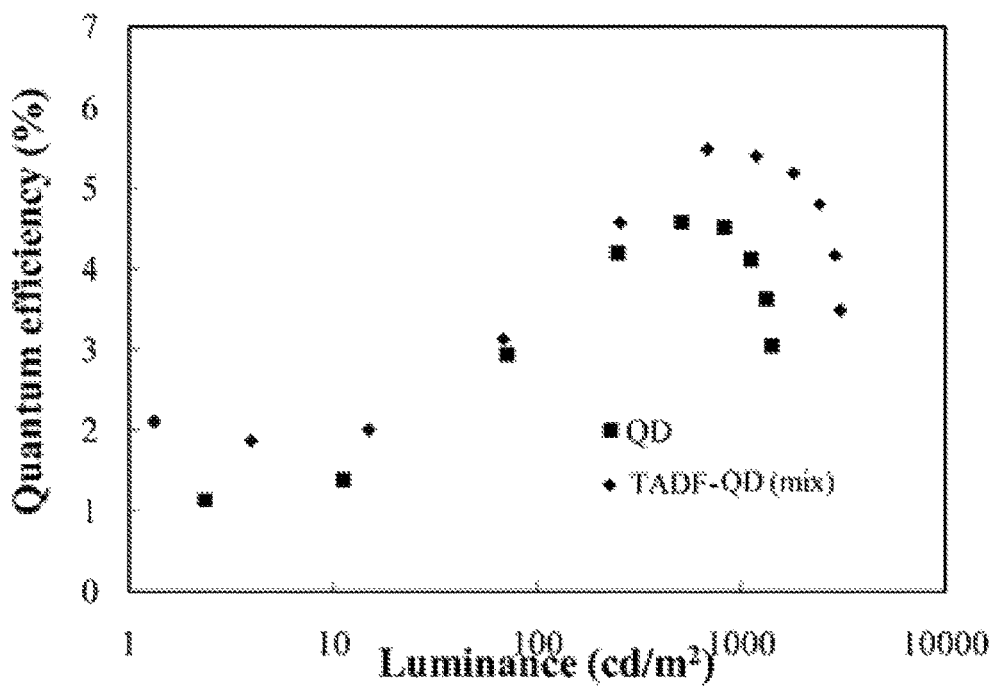

FIGS. 2A, 2B, and 2C are graphs for comparing luminous efficiencies of a delayed fluorescence-QD-electroluminescent diode (TADF-QD(mix)) according to the first embodiment of the present invention and a QD-electroluminescent diode (QD) according to comparative example 1. Both the delayed fluorescence-QD-electroluminescent diode (TADF-QD(mix)) according to the first embodiment of the present invention and the QD-electroluminescent diode (QD) according to comparative example 1 are manufactured to have the same configuration in which a light emitting layer is formed between a anode and a cathode, the light emitting layer of the delayed fluorescence-QD-electroluminescent diode (TADF-QD(mix)) according to the first embodiment of the present invention is formed by mixing bis [4-(9,9-dimethyl-9,10-dihydroacridine)phenyl]sulfone (DMAC-DPS), which is a delayed fluorescence material thereof and, a CdSe/ZnS quantum dot, and the light emitting layer of the QD-electroluminescent diode (QD) according to comparative example 1 is formed using only the CdSe/ZnS quantum dot.

Meanwhile, the following Table 1 shows a result obtained by measuring the luminous efficiencies of the delayed fluorescence-QD-electroluminescent diode (TADF-QD(mix)) according to the first embodiment of the present invention and the QD-electroluminescent diode (QD) according to comparative example 1 from FIGS. 2A, 2B, and 2C.

TABLE 1

| Ligand type | QE(%) | | CE(cd/A) | |
| --- | --- | --- | --- | --- |
| | 1000 cd | Max | 1000 cd | Max |
| QD | 4.29 | 4.58 | 9.38 | 10.04 |
| TADF-QD(mix) | 5.43 | 5.43 | 12.27 | 12.38 |

Referring to FIGS. 2A, 2B, and 2C with Table 1, it may be seen that quantum efficiency (QE) and current efficiency (CE) of the delayed fluorescence-QD-electroluminescent diode (TADF-QD(mix)) according to the first embodiment of the present invention are remarkably improved when compared to those of the QD-electroluminescent diode (QD) according to comparative example 1.

Figure 3:
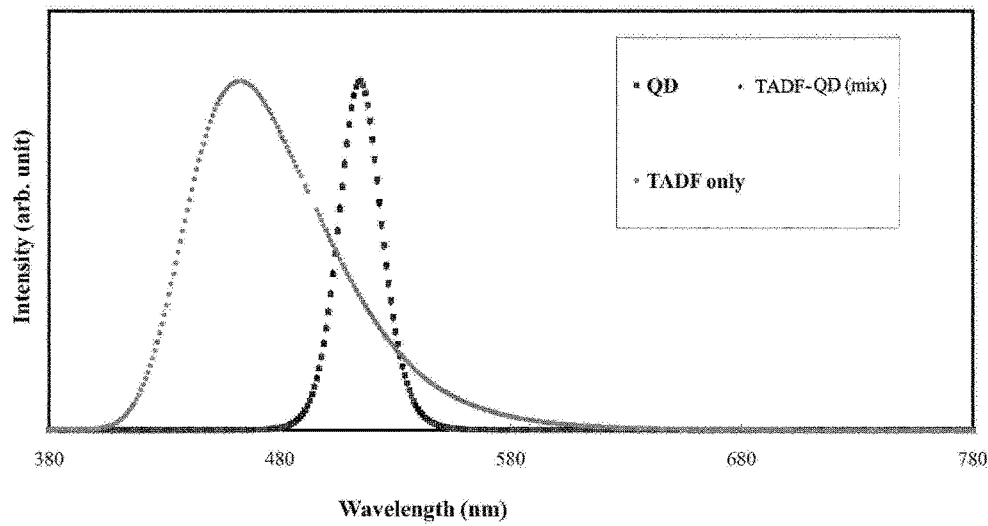
FIG. 3 is a graph obtained by measuring light emitting wavelengths of the delayed fluorescence-QD-electroluminescent diode (TADF-QD(mix)) according to the first embodiment of the present invention, the QD-electroluminescent diode (QD) according to comparative example 1, and an OLED (TADF only) according to comparative example 2.

FIG. 3 is a graph obtained by measuring light emitting wavelengths of the delayed fluorescence-QD-electroluminescent diode (TADF-QD(mix)) according to the first embodiment of the present invention, the QD-electroluminescent diode (QD) according to comparative example 1, and an OLED (TADF only) according to comparative example 2. The OLED (TADF only) according to comparative example 2 is manufactured to include a light emitting layer formed of DMAC-DPS, which is a thermally activated delayed fluorescence (TADF) material, between an anode and a cathode thereof.

Referring to FIG. 3, a wavelength generated in the delayed fluorescence-QD-electroluminescent diode (TADF-QD(mix)) according to the first embodiment of the present invention was measured as being completely equal to a wavelength generated in the QD-electroluminescent diode (QD) according to comparative example 1 and being different from a wavelength generated in the OLED (TADF only) according to comparative example 2. That is, in the delayed fluorescence-QD-electroluminescent diode (TADF-QD(mix)) according to the first embodiment of the present invention, light generated by the delayed fluorescence material being mixed with the quantum dot was mostly not detected. Accordingly, a reason that luminous efficiency was improved in the delayed fluorescence-QD-electroluminescent diode (TADF-QD(mix)) according to the first embodiment of the present invention is not that the delayed fluorescence material does not emit fluorescent light regardless of the QD but that energy of the delayed fluorescence material is transferred to the QD.

Figure 4:
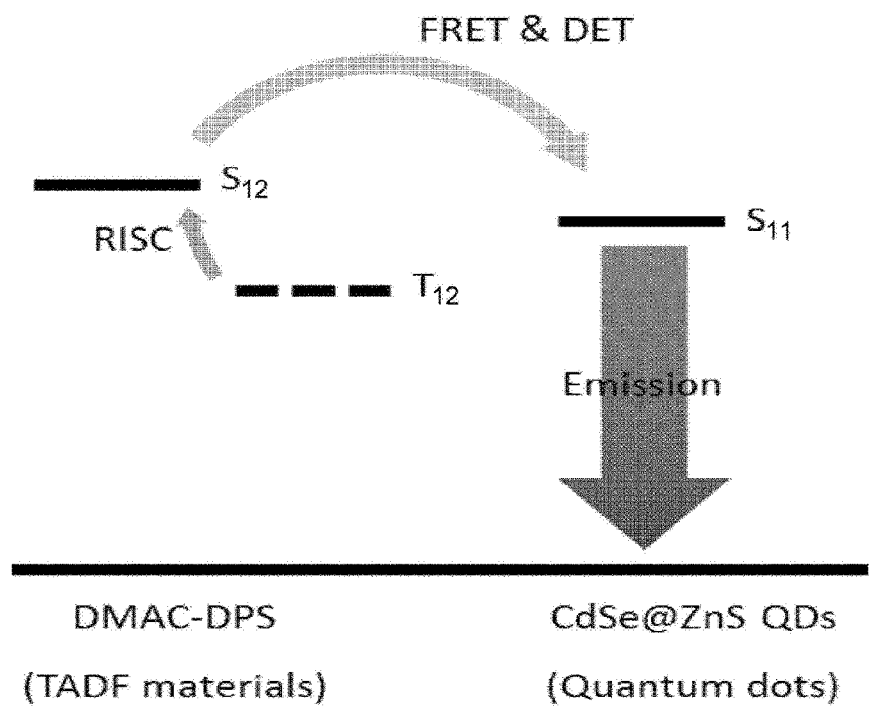
FIG. 4 is a schematic diagram showing a mechanism in which energy is transferred from a delayed fluorescence material to a QD.

In detail, as shown in FIG. 4, the reason that the luminous efficiency was improved in the delayed fluorescence-QD-electroluminescent diode (TADF-QD(mix)) according to the first embodiment of the present invention was that much more fluorescent light was emitted because many more QDs or electrons become in an excited state in comparison to when the delayed fluorescence material is not mixed as energy of electrons excited to a singlet energy $S_{12}$ state in the delayed fluorescence material 2 is transferred to the QD 1, and the electrons in the QD are excited in a singlet energy $S_{11}$ state. Accordingly, it is preferable that the light emitting layer 30 be formed by mixing the QD 1 and the delayed fluorescence material 2 so that the energy of the electrons excited in the singlet energy $S_{12}$ state of the delayed fluorescence material 2 is transferred to the QD 1, and an energy level of the excited singlet energy $S_{12}$ of the delayed fluorescence material 2 is equal to or greater than that of the excited singlet energy $S_{11}$ of the QD 1.

In this case, when considering excited efficiency of the QD and energy transfer of the delayed fluorescence material, the QD and the delayed fluorescence material may be mixed to have a mass ratio of about 1:2 to 1:100, and a proper mixing ratio may be determined within the mass ratio according to a kind of QD and a color of emitted light.

Figure 5:
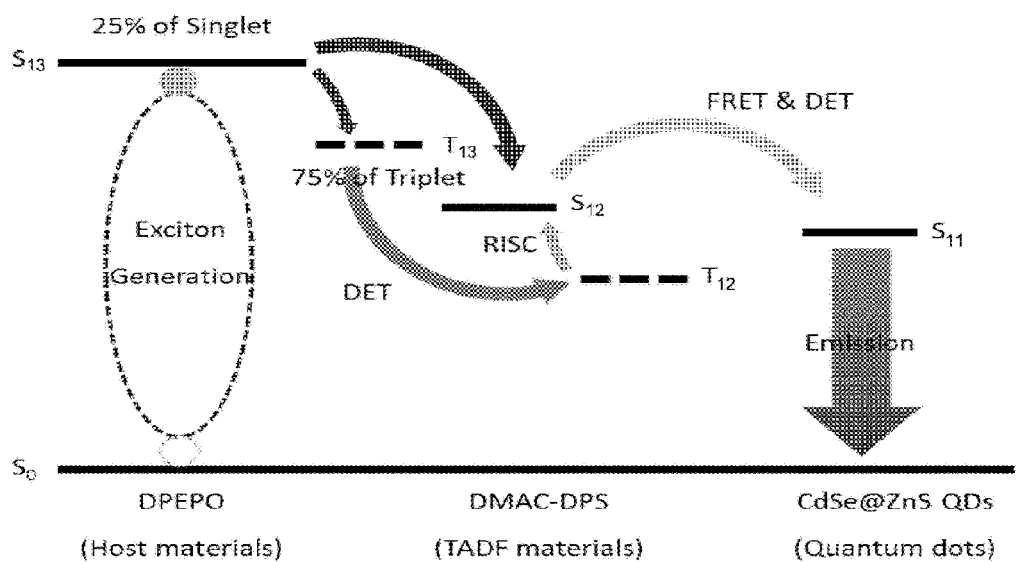
FIG. 5 is a schematic diagram showing a mechanism in which energy is transferred from a host material to a delayed fluorescence material and the energy is retransferred from the delayed fluorescence material to a QD.

Further, as shown in FIG. 5, it is preferable that many more host materials which supply energy to the delayed fluorescence material be further mixed therewith so that many more delayed fluorescence materials reach the singlet energy state.

In this case, it is preferable that excited singlet energy $S_{13}$ and/or excited triplet energy $T_{13}$ of the host material have an energy level that is equal to or greater than the excited singlet energy $S_{12}$ of the delayed fluorescence material. In this case, as an example of the host material, a known host material which emits delayed fluorescent light may be used without limitation. For example, bis(2-(diphenylphosphino) phenyl)ether oxide (DPEPO) may be used as the host material of DMAC-DPS.

When the light emitting layer 30 is formed by further mixing the host material in order to improve luminous efficiency thereof, since a ratio of the delayed fluorescence material that reaches the singlet energy state due to the host material is increased, the light emitting layer may be formed by mixing the QD, the delayed fluorescence material, and the host material at a mass ratio of about 1:1:1 to 1:1:100. In this case, it is preferable that a mixing ratio of the host material be determined by considering a mixing ratio of the delayed fluorescence material and the host material capable of showing the greatest external quantum efficiency in a device not including the QD.

Figure 6:
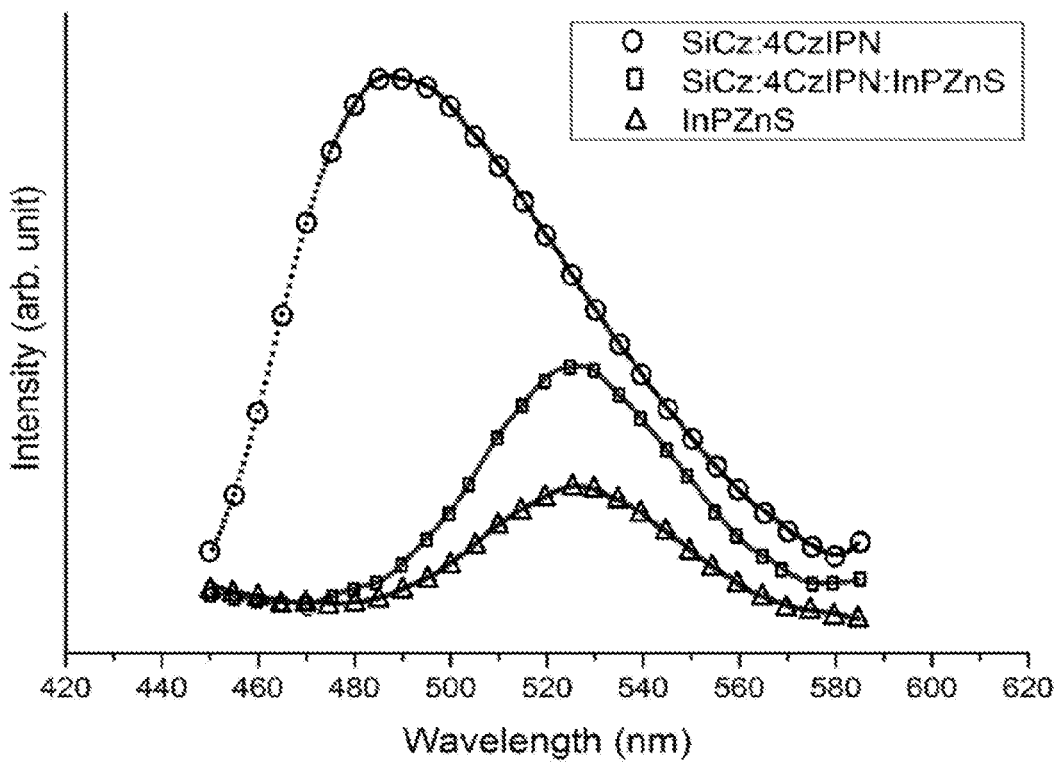
FIG. 6 is a graph obtained by measuring light emitting wavelengths of a delayed fluorescence-QD-electroluminescent diode (SiCz:4CzIPN:InPZnS) according to a second embodiment of the present invention, a QD-electroluminescent diode (InPZnS) according to comparative example 3, and an OLED (SiCz:4CzIPN) according to comparative example 4.

FIG. 6 is a graph obtained by measuring light emitting wavelengths of a delayed fluorescence-QD-electroluminescent diode (SiCz:4CzIPN:InPZnS) according to a second embodiment of the present invention, a QD-electroluminescent diode (InPZnS) according to comparative example 3, and an OLED (SiCz:4CzIPN) according to comparative example 4. All of the delayed fluorescence-QD-electroluminescent diode (SiCz:4CzIPN:InPZnS) according to the second embodiment of the present invention, the QD-electroluminescent diode (InPZnS) according to comparative example 3, and the OLED (SiCz:4CzIPN) according to comparative example 4 are manufactured to have the same structure in which a light emitting layer is formed between an anode and a cathode, but the light emitting layer of the delayed fluorescence-QD-electroluminescent diode (SiCz:4CzIPN:InPZnS) according to the second embodiment of the present invention may be formed of a compound of SiCz which is a host material, 4CzIPN which is a delayed fluorescence material, and an InP/ZnS QD, the light emitting layer of the QD-electroluminescent diode (InPZnS) according to comparative example 3 may be formed of a compound of SiCz which is a host material and 4CzIPN which is a delayed fluorescence material, and the light emitting layer of the OLED (SiCz:4CzIPN) according to comparative example 4 may be formed of an InP/ZnS QD.

Referring to FIG. 6, it shows that a wavelength of light generated in the delayed fluorescence-QD-electroluminescent diode (SiCz:4CzIPN:InPZnS) according to the second embodiment of the present invention is substantially the same as that generated in the QD-electroluminescent diode (InPZnS) according to comparative example 3, and particularly, luminous efficiency of the delayed fluorescence-QD-electroluminescent diode (SiCz:4CzIPN:InPZnS) according to the second embodiment of the present invention is improved when compared with that of the QD-electroluminescent diode (InPZnS) according to comparative example 3.

Figure 7:
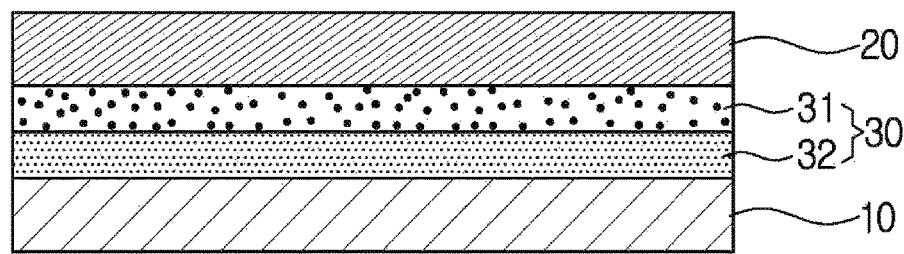
FIG. 7 is a cross-sectional view illustrating a delayed fluorescence-QD-electroluminescent diode 100' according to the second embodiment of the present invention.

FIG. 7 is a cross-sectional view illustrating a delayed fluorescence-QD-electroluminescent diode 100' according to the second embodiment of the present invention.

Referring to FIG. 7, the delayed fluorescence-QD-electroluminescent diode 100' according to the second embodiment of the present invention may include an anode 10, a cathode 20, and a light emitting layer 30 located between the anode 10 and the cathode 20.

The light emitting layer 30 may include a QD layer 31 including a QD, and a delayed fluorescence layer 32 including a delayed fluorescence material which supplies energy to the QD. That is, unlike the delayed fluorescence-QD-electroluminescent diode 100 described with reference to FIG. 1, the light emitting layer 30 may have a structure in which the QD layer 31 including the QD and the delayed fluorescence layer 32 including the delayed fluorescence material are stacked.

In the embodiment, although an example in which the light emitting layer 30 is composed of one QD layer 31 and one delayed fluorescence layer 32 is illustrated in FIG. 7, the light emitting layer 30 may have a structure in which a plurality of QD layers 31 and a plurality of delayed fluorescence layers 32 are repeatedly alternately stacked, or a structure in which the plurality of QD layers 31 are continuously stacked and the delayed fluorescence layer 32 is located above or below the plurality of QD layers 31.

Further, in order to balance charge injection and recombination processes of the cathode, a hole injection layer and a hole transporting layer may be further included between the anode 10 and the light emitting layer 30, and an electron transporting layer and an electron injection layer may be further included between the cathode 20 and the light emitting layer 30.

In this case, since a lowest unoccupied molecular orbital (LUMO) level of the QD is low when compared with other organic materials, it is preferable that the QD layer 31 be arranged to be closer to the cathode 20 than the delayed fluorescence layer 32 so as to be close to the hole transporting layer, which has a high electron mobility.

Figure 8A:
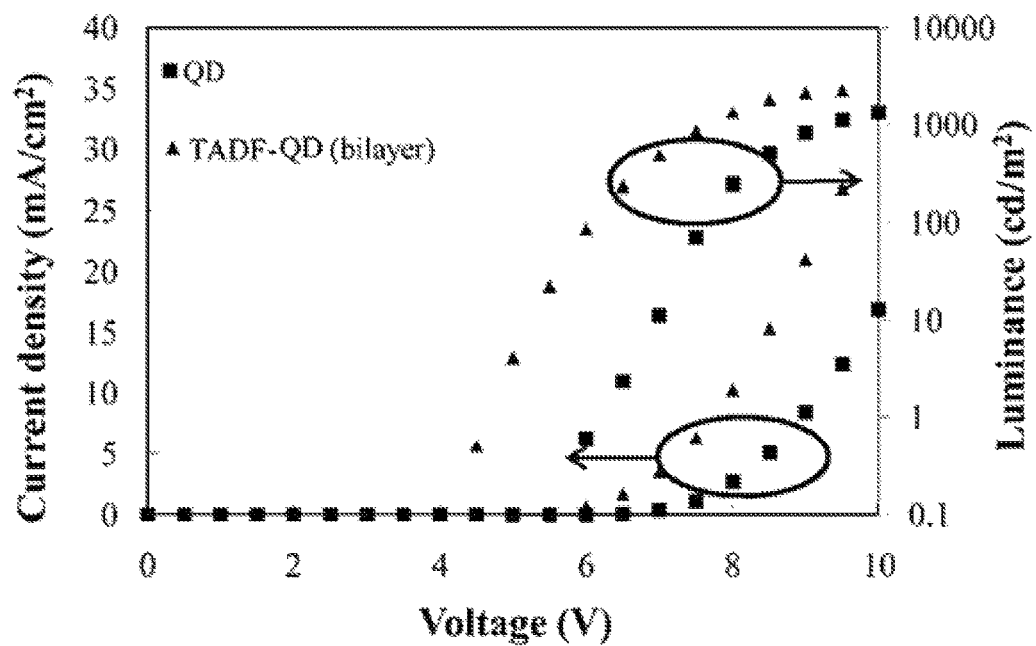
FIGS. 8A to 8C are graphs for comparing luminous efficiency between a delayed fluorescence-QD-electroluminescent diode (TADF-QD(bilayer)) according to a third embodiment of the present invention and the QD-electroluminescent diode (QD) according to comparative example 1.
Figure 8B:
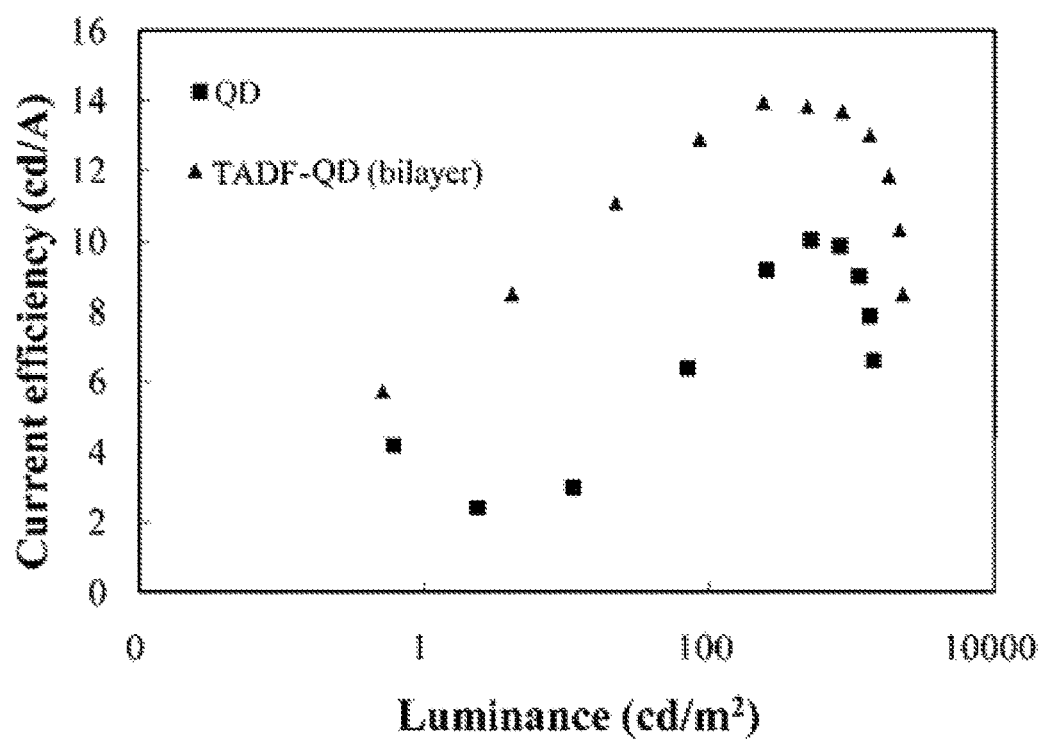
Figure 8C:
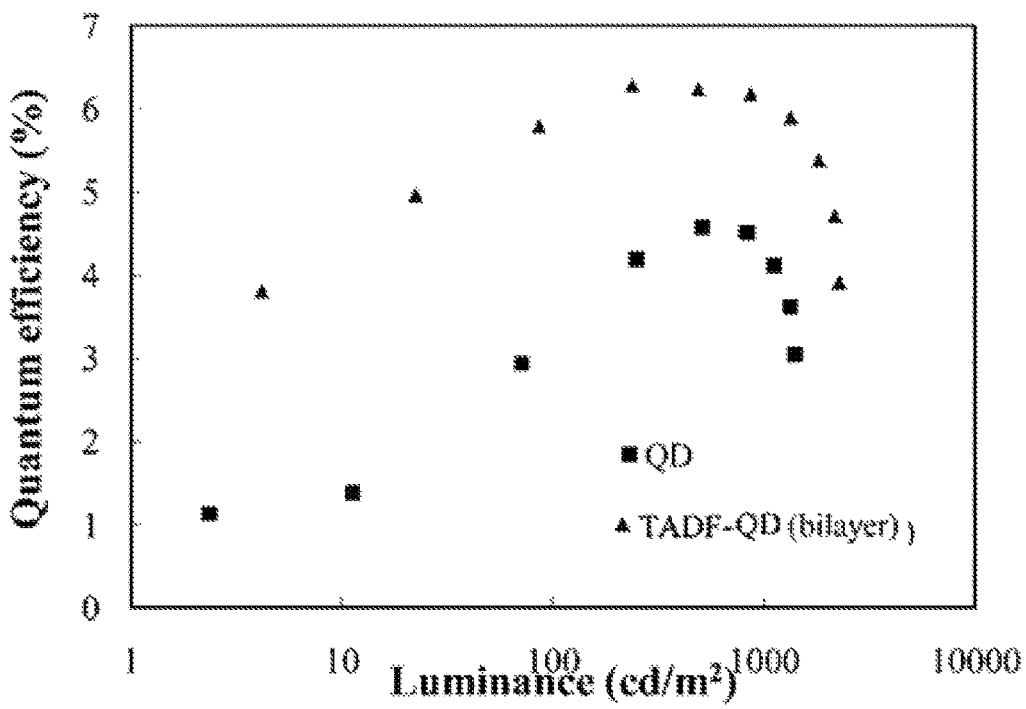

FIGS. 8A, 8B, and 8C are graphs for comparing luminous efficiency between a delayed fluorescence-QD-electroluminescent diode (TADF-QD(bilayer)) according to a third embodiment of the present invention and the QD-electroluminescent diode (QD) according to comparative example 1. Both of the delayed fluorescence-QD-electroluminescent diode (TADF-QD(bilayer)) according to the third embodiment of the present invention and the QD-electroluminescent diode (QD) according to comparative example 1 are manufactured to have the same structure in which a light emitting layer is formed between an anode and a cathode, but the light emitting layer of the delayed fluorescence-QD-electroluminescent diode (TADF-QD(bilayer)) according to the third embodiment of the present invention may be formed to have a structure in which a delayed fluorescence layer formed of DMAC-DPS, which is the delayed fluorescence material, and a CdSe/ZnS QD layer are continuously stacked, and the light emitting layer of the QD-electroluminescent diode (QD) according to comparative example 1 may be formed using only a CdSe/ZnS QD.

Meanwhile, the following Table 2 is a result obtained by measuring the light emitting efficiencies of the delayed fluorescence-QD-electroluminescent diode (TADF-QD(bilayer)) according to the third embodiment of the present invention and the QD-electroluminescent diode (QD) according to comparative example 1 from FIGS. 8A, 8B, and 8C.

TABLE 2

| Ligand type | QE(%) | | CE(cd/A) | |
|---|---|---|---|---|
| | 1000 cd | Max | 1000 cd | Max |
| QD | 4.29 | 4.58 | 9.38 | 10.04 |
| TADF-QD(bilayer) | 6.11 | 6.29 | 13.49 | 13.94 |

Referring to FIGS. 8A, 8B, and 8C with Table 2, it may be seen that quantum efficiency (QE) and current efficiency (CE) of the delayed fluorescence-QD-electroluminescent diode (TADF-QD(bilayer)) according to the third embodiment of the present invention are remarkably improved when compared with those of the QD-electroluminescent diode (QD) according to comparative example 1.

Figure 9:
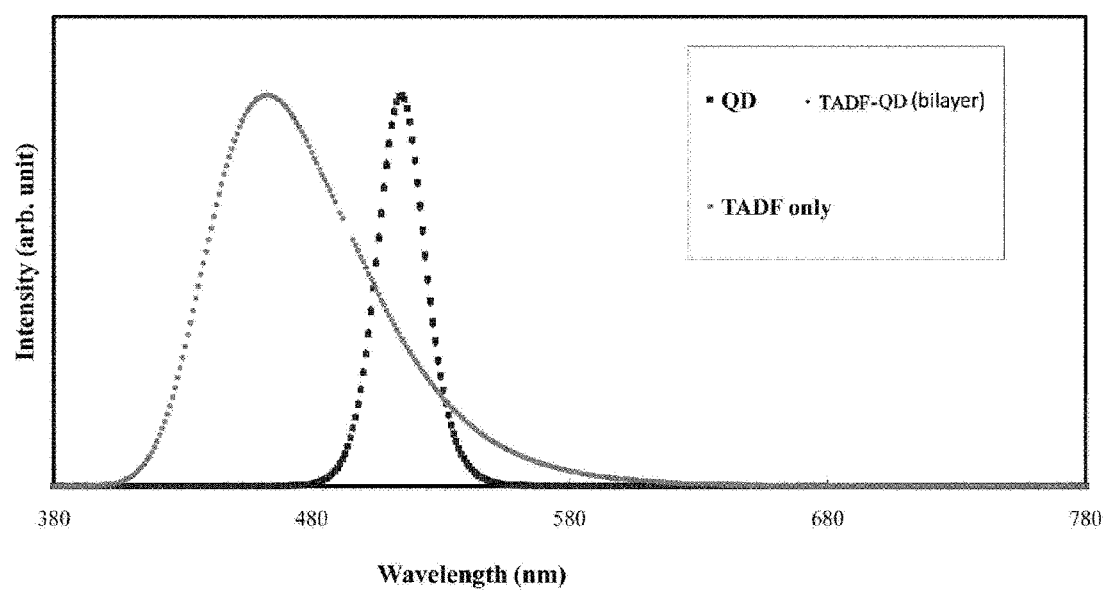
FIG. 9 is a graph obtained by measuring light emitting wavelengths of the delayed fluorescence-QD-electroluminescent diode (TADF-QD(bilayer)) according to the third embodiment of the present invention, the QD-electroluminescent diode (QD) according to comparative example 1, and the OLED (TADF only) according to comparative example 2.

FIG. 9 is a graph obtained by measuring light emitting wavelengths of the delayed fluorescence-QD-electroluminescent diode (TADF-QD(bilayer)) according to the third embodiment of the present invention, the QD-electroluminescent diode (QD) according to comparative example 1, and the OLED (TADF only) according to comparative example 2.

Referring to FIG. 9, a wavelength of light generated in the delayed fluorescence-QD-electroluminescent diode (TADF-QD(bilayer)) according to the third embodiment of the present invention was measured as being completely equal to a wavelength of light generated in the QD-electroluminescent diode (QD) according to comparative example 1 and as being different from a wavelength of light generated in the OLED (TADF only) according to comparative example 2. That is, in the delayed fluorescence-QD-electroluminescent diode (TADF-QD(bilayer)) according to the third embodiment of the present invention, light generated by the delayed fluorescence material mixed with the QD was mostly not detected. Accordingly, a reason for which luminous efficiency was improved in the delayed fluorescence-QD-electroluminescent diode (TADF-QD(bilayer)) according to the third embodiment of the present invention is not that the delayed fluorescence material does not emit fluorescent light regardless of the QD but that energy of the delayed fluorescence material is transferred to the QD.

Meanwhile, in a manner the same as or similar to the manner described above, it is preferable that an energy level of the excited singlet energy $S_{12}$ of the delayed fluorescence material 2 forming the delayed fluorescence layer 32 be equal to or greater than that of the excited singlet energy $S_{11}$ of the QD forming the QD layer 31.

Further, thicknesses of the QD layer 31 and the delayed fluorescence layer 32 should be formed so that a recombination region of an electron and a hole is formed in the delayed fluorescence layer 32, and in consideration of this, it is preferable that the thicknesses of the QD layer 31 and the delayed fluorescence layer 32 be almost the same, or the thickness of the delayed fluorescence layer 32 be slightly greater than that of the QD layer 31.

Moreover, as shown in FIG. 5, the delayed fluorescence layer 32 may further include a host material 3 which supplies energy to the delayed fluorescence material 2 so that many more delayed fluorescence materials reach the singlet energy state. In this case, it is preferable that the excited singlet energy $S_{13}$ and/or the excited triplet energy $T_{13}$ of the host material have an energy level that is equal to or greater than the excited singlet energy Su of the delayed fluorescence material.

In the delayed fluorescence layer 32, it is preferable that the delayed fluorescence material and the host material be mixed at a mass ratio of about 1:1 to 1:100.

The present invention has an effect of providing a QD-electroluminescent diode in which luminous efficiency is improved using an energy transfer mechanism. Particularly, the present invention may provide the QD-electroluminescent diode in which the luminous efficiency is improved by receiving energy of a delayed fluorescence material or receiving the energy of the delayed fluorescence material that receives energy from a host material to emit light.

As described above, the delayed fluorescence-QD-electroluminescent diode according to embodiments of the present invention has been described with reference to specific and limited embodiments. More particularly, the delayed fluorescence-QD-electroluminescent diode 100 using DMAC-DPS which is a delayed fluorescence material, CdSe/ZnS which is the QD, and DPEPO which is a host material, has been described as the specific embodiment, and the data related to the diode has been illustrated in the accompanying drawings so that the delayed fluorescence-QD-electroluminescent diode according to the embodiment of the present invention could be more easily understood, but those skilled in the art should easily understand that the scope of the present invention is not limited thereto and that the delayed fluorescence-QD-electroluminescent diode according to the embodiment of the present invention is formed using all of the delayed fluorescence material, the quantum dot, and the host material. As such, the present invention is not limited to the specific embodiment, and it should be apparent to those skilled in the art that various modifications can be made to the above-described embodiments of the present invention without departing from the spirit or the scope of the invention claimed in the appended claims.

What is claimed is:

1. A delayed fluorescence-quantum dot electroluminescent diode comprising:
   an anode;
   a cathode; and
   a light emitting layer located between the anode and the cathode,
   wherein the light emitting layer comprises a quantum dot layer including a quantum dot and a delayed fluorescence layer including a delayed fluorescence material, which is disposed above or below the quantum dot layer, and which supplies energy to the quantum dot.

2. The diode of claim 1, wherein the light emitting layer comprises a mixture of the quantum dot and the delayed fluorescence material.

3. The diode of claim 2, wherein the quantum dot and the delayed fluorescence material is mixed at a mass ratio of 1:2 to 1:100.

4. The diode of claim 2, wherein excited singlet energy of the delayed fluorescence material is equal to or greater than excited singlet energy of the quantum dot.

5. The diode of claim 2, wherein the light emitting layer further includes a host material which supplies the energy to the delayed fluorescence material.

6. The diode of claim 5, wherein excited singlet energy or excited triplet energy of the host material is equal to or greater than excited singlet energy of the delayed fluorescence material.

7. The diode of claim 1, wherein the quantum dot layer is located between the delayed fluorescence layer and the cathode.

8. The diode of claim 1, wherein a recombination region of an electron injected through the cathode and a hole injected through the anode is formed in the delayed fluorescence layer.

9. The diode of claim 8, wherein a thickness of the quantum dot layer is equal to or greater than that of the delayed fluorescence layer.

10. The diode of claim 1, wherein the delayed fluorescence layer further comprises a host material which supplies energy to the delayed fluorescence material.

11. The diode of claim 10, wherein excited singlet energy or excited triplet energy of the host material is equal to or greater than excited singlet energy of the delayed fluorescence material.

12. The diode of claim 10, wherein the delayed fluorescence material and the host material are mixed at a mass ratio of 1:1 to 1:100.

13. A method of manufacturing a delayed fluorescence-quantum dot electroluminescent diode, comprising:
   forming an anode;
   forming a light emitting layer; and
   forming a cathode,
   wherein the light emitting layer comprising a mixture of a quantum dot layer including a quantum dot and a delayed fluorescence layer, which is disposed above or below the quantum dot layer, including a delayed fluorescence material which supplies energy to the quantum dot is formed to be located between the anode and the cathode.

14. A method of manufacturing a delayed fluorescence-quantum dot electroluminescent diode, comprising:
   forming an anode;
   forming a light emitting layer on the anode; and
   forming a cathode on the light emitting layer,
   wherein the light emitting layer is formed by stacking a quantum dot layer including a quantum dot and a delayed fluorescence layer including a delayed fluorescence material which supplies energy to the quantum dot, and the quantum dot layer is located between the delayed fluorescence layer and the cathode.

* * * * *